United States Patent [19]
El Hajji

[11] Patent Number: 6,002,628
[45] Date of Patent: Dec. 14, 1999

[54] DYNAMIC RANDOM ACCESS MEMORY DEVICE WITH REDUCED REFRESH DURATION, AND CORRESPONDING REFRESH PROCESS

[75] Inventor: Noureddine El Hajji, Grenoble, France

[73] Assignee: STMicroelectronics S.A., Gentilly, France

[21] Appl. No.: 09/170,816

[22] Filed: Oct. 13, 1998

[30] Foreign Application Priority Data

Oct. 14, 1997 [FR] France .................................. 97 12819

[51] Int. Cl.[6] .......................................... G11C 7/00
[52] U.S. Cl. ...................... 365/222; 365/189.02; 365/154
[58] Field of Search .................................. 365/222, 154, 365/156, 149, 189.02, 189.04, 230.02

[56] References Cited

U.S. PATENT DOCUMENTS

| 4,023,149 | 5/1977 | Bormann et al. | 340/173 R |
| 5,881,010 | 3/1999 | Artieri | 365/222 |

FOREIGN PATENT DOCUMENTS

| 0681331 | 11/1995 | European Pat. Off. | H01L 27/108 |

OTHER PUBLICATIONS

"New Architecture of Transparent Refresh For RAM", *IBM Technical Disclosure Bulletin*, vol. 32, No. 12, May 1, 1990, pp. 271–273.

*Primary Examiner*—David Nelms
*Assistant Examiner*—David Lam
*Attorney, Agent, or Firm*—Allen, Dyer, Doppelt, Milbrath & Gilchrist, P.A.

[57] ABSTRACT

A dynamic random access memory device with reduced refresh duration, and corresponding refresh process includes a plurality of memory cells. All of the memory cells of one and the same column are connected between two column metallizations, and each comprise four insulated-gate field-effect transistors. The four transistors include two storage transistors both possessing the same first quotient of their channel width to their channel length. The four transistors also include two access transistors both possessing the same second quotient of their channel width to their channel length. The ratio of the first quotient to the second quotient is greater than or equal to one. The ratio of the capacitance of a column metallization and the gate/source capacitance of each storage transistor is at least equal to 50. During a specific refresh cycle, several memory cells of one and the same column are selected simultaneously.

27 Claims, 3 Drawing Sheets

DYNAMIC RANDOM ACCESS MEMORY DEVICE WITH REDUCED REFRESH DURATION, AND CORRESPONDING REFRESH PROCESS

FIELD OF THE INVENTION

The invention relates to memories, and, more particularly, to dynamic random access memories (DRAMs) and their refresh cycles.

BACKGROUND OF THE INVENTION

Unlike static random access memories (SRAMs) in which the information stored remains stored indefinitely at least as long as these memories remain energized, dynamic memories have the particular feature of requiring periodic refreshing of the information stored. This is so because of the stray leakage currents which discharge the storage capacitor of each memory cell (memory slot). This refreshing is conventionally performed in the course of a read/re-write cycle consequently requiring a specific phase for re-writing the data read, since reading is destructive.

Among the known memory cells of dynamic random access memory, mention may be made in particular of those containing two or three transistors and those containing a single transistor, the information in which is, moreover, destroyed by reading. The total refresh duration of a conventional random access memory whose memory cells are organized in rows and columns depends on the number of rows in the memory. Thus, those skilled in the art are aware that it is only possible to refresh one row at a time by virtue of the destructive nature of the reading of the stored information.

Now, it is especially advantageous to be able to reduce the total refresh duration so as to correspondingly decrease the period of unavailability of the memory. A known approach includes subdividing the memory into several blocks each comprising a matrix of memory cells. By then simultaneously selecting one row from each block, the refresh duration is correspondingly decreased. However, it is still only possible to select one row at a time from each block.

SUMMARY OF THE INVENTION

An object of the invention is to provide a radically different structure of a memory cell of a dynamic random access memory, the reading of data from which does not destroy the latter, furthermore allowing, in particular, very short automatic refreshing of the data read. This automatic refreshing, therefore, does not require any specific re-write phase, and consequently allows specific refresh cycles in the course of which several rows of the matrix may be selected in such a way as to refresh several cells simultaneously.

The object of the invention is also to propose a memory structure in which the area occupied by the circuits required to read/write the memory plane (overhead) is less than that of the corresponding circuits associated with known dynamic random access memories.

The object of the invention is also to propose a memory structure which uses a smaller number of metallization levels, thus decreasing the probability of a structural defect.

The invention, therefore, is directed to a dynamic random access memory device comprising at least one block of memory cells organized in rows and columns, as well as row selection means associated with the block and possessing a first state (for example, a read or write state) in which the row selection means is able to select a single row of memory cells of the block. According to a general characteristic of the invention, all the memory cells of one and the same column are connected by two column metallizations (a first column metallization or bit line and an immediately adjacent reference column metallization), and each memory cell comprise four insulated-gate field-effect transistors.

These four transistors are made up of two storage transistors and two access transistors. The two storage transistors both possess the same quotient of their channel width W1 to their channel length L1, and two access transistors both possess the same quotient of their channel width W2 to their channel length L2. The ratio of the first quotient W1/L1 to the second quotient W2/L2 is greater than or equal to 1 and, preferably, greater than or equal to 2.

Moreover, the ratio of the capacitance of a column metallization to the gate/source capacitance of each storage transistor is at least equal to 50, and preferably at least equal to 100. Furthermore, the row selection means possess a second state (a specific refresh state) in which they are able to select several rows of memory cells of the block simultaneously.

As will be seen in greater detail below, the memory cell with four transistors according to the invention can be refreshed, read or written. However, in fact, during a read cycle, the refresh is performed at the start of this read cycle so that the memory cell is automatically refreshed when it is read. Now, in the course of this operation, a voltage spike appears on the side of the node which had been taken to the zero potential during writing. Additionally, if this voltage spike is too large, the memory cell may lose its data, refresh in the wrong direction and ultimately read out erroneous data.

Choosing the above-mentioned ratio of the two quotients W/L makes it possible to avoid such a malfunction. Moreover, the fact that the stray capacitance of the column metallization is very large relative to the gate/source storage capacitance makes it possible to obtain an extremely short refresh duration, that is to say an extremely short duration of charge transfer from the column metallization capacitance to the gate/source capacitance of a storage transistor. Consequently, when a memory slot is refreshed, the pre-charge level of the metallization line has virtually not altered. Hence, even if in one and the same column, two memory cells respectively storing a logic "1" and a logic "0" are refreshed simultaneously, the refresh operation does not create a voltage drop on the column metallization sufficient to cause the memory cells to toggle in the wrong direction and ultimately to refresh data which does not correspond to the data stored initially.

Of course, the larger the number of rows selected and the greater, within one and the same column, the number of memory cells to be refreshed which store a "0" as compared with the number of memory cells to be refreshed which store a "1", the larger will be the voltage drop on the column metallizations, and the greater will be the reduction in the quality of the information refreshed. In practice, eight rows of cells will typically be selected at a time, that is to say eight memory cells at a time will by choice be refreshed within the same column.

Moreover, during a specific refresh cycle of this type, the duration of the pulse of the signal transmitted on the selected wordlines must be greater than the duration of charge transfer from the column metallization capacitance to the gate/source capacitance of a storage transistor. The duration of this pulse must also be less than the discharge duration of the column metallization capacitance. In practice, a pulse duration almost equal to the duration of charge transfer from the column metallization capacitance to the gate/source capacitance of a storage transistor will be chosen.

According to one embodiment of the invention, each memory cell comprises a first input and a second input for respectively receiving, during the read and write phases, two control voltages (corresponding to the voltages applied to the two column metallizations). Each memory cell also comprises a selection input for receiving a row selection voltage conveyed by a specific row metallization (wordline). Furthermore, the source of a first access transistor is linked to the first input, while the source of the second access transistor is linked to the second input. The drain of the first access transistor is linked to the drain of a first storage transistor and to the gate of the second storage transistor, while the drain of the second access transistor is linked to the drain of the second storage transistor and to the gate of the first storage transistor. The sources of the two storage transistors are together linked to a first bias voltage (for example, ground in the case of NMOS transistors or else the high voltage level VDD in the case of PMOS transistors). Lastly, the gates of the two access transistors are linked to the selection input and consequently to the wordline. The four transistors may be NMOS transistors or PMOS transistors.

To reduce the leakage currents especially through the drain-source path of the storage transistors, and, hence, to improve the retention time of the stored data, it is possible to bias the substrates of all the transistors suitably so as to obtain, using the substrate effect, an increase in the threshold voltage and consequently an increase in retention time. Within the meaning of the invention, the term "substrate" (or "bulk") denotes the substrate proper when the transistor is not placed in a well, or indeed the well if there is one. More precisely, in the case of NMOS transistors, the well will advantageously be biased negatively, while in the case of PMOS transistors the well will advantageously be biased to a voltage greater than the voltage VDD.

More generally, the substrates of all the transistors are preferably linked to a second predetermined bias voltage. The first and second bias voltages are chosen so that the difference between the second bias voltage and the first bias voltage is negative or zero in the case of NMOS transistors, while remaining greater than the additive inverse of the threshold voltage of the transistors. In the case of PMOS transistors, the difference between the second bias voltage and the first bias voltage is chosen to be positive or zero, while remaining less than the sum of the first bias voltage and the threshold voltage of the transistors.

BRIEF DESCRIPTION OF THE DRAWINGS

Other advantages and characteristics of the invention will emerge on examining the detailed description of an entirely non-limiting embodiment and of the appended drawings in which.

DETAILED DESCRIPTION OF THE PREFERRED EMBODIMENTS

Figure 1:
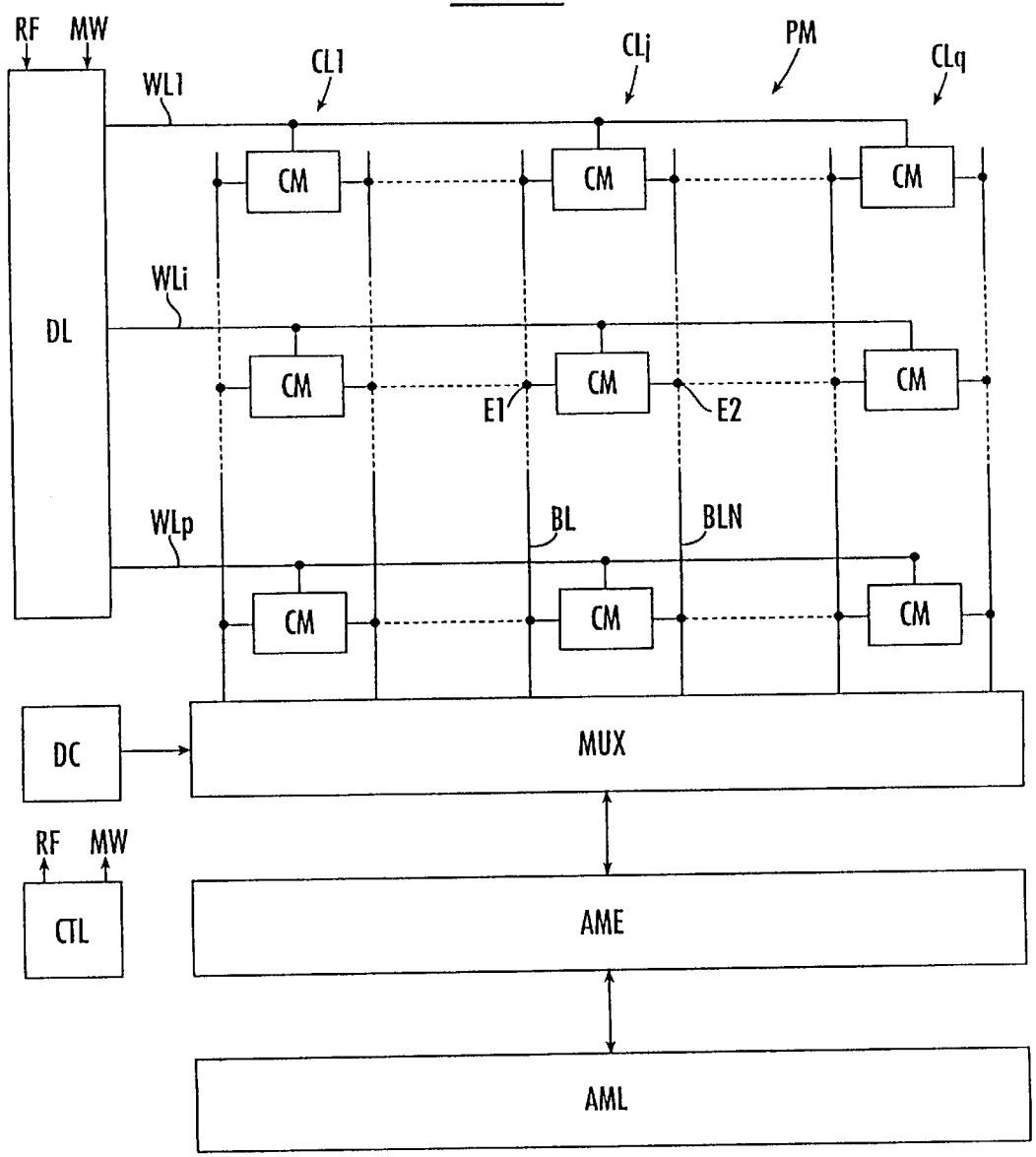
FIG. 1 diagrammatically illustrates a memory plane of a dynamic random access memory according to the invention, and its associated circuits.

Represented in FIG. 1 is a random access memory device according to the invention whose memory plane PM comprises a single block of memory cells CM organized in rows and columns. In the example described, it is assumed that the memory block comprises p rows and q columns. Each memory cell CM comprises two inputs E1 and E2 respectively connected to two adjacent column metallizations BL and BLN, to receive control voltages for in particular, reading and writing the data stored in the memory cell.

Moreover, in a conventional manner, each memory cell is selected by a signal WL conveyed by a row metallization WL or wordline. The memory device comprises, in the conventional manner, circuits associated with the memory plane PM and intended for reading, writing or refreshing this memory plane. These circuits comprise a row decoder DL whose outputs are linked to the various wordlines WLi so as to deliver the corresponding selection signals WLi. A column decoder is also provided, associated with a multiplexer MUX for selecting one or more columns CLj. Thus, in the read and write phase, the combination of the selection of a wordline WLi and of columns CLj makes it possible to select a memory word of the memory plane, contained in the same wordline.

The multiplexer MUX is also linked in the conventional manner to a write amplifier AME, as well as to read amplifier AML whose construction is known per se. Lastly, command means CTL, constructed in a manner known per se, deliver, in particular, control words MW to the row decoder DL which makes it possible to select a particular wordline WLi in the read or write phase. Furthermore, according to the invention, the command means deliver a control signal RF representative of a specific refreshing of the memory plane and making it possible, when this signal is activated, to select several wordlines of the memory plane PM simultaneously. This point will be returned to in greater detail later.

Figure 2:
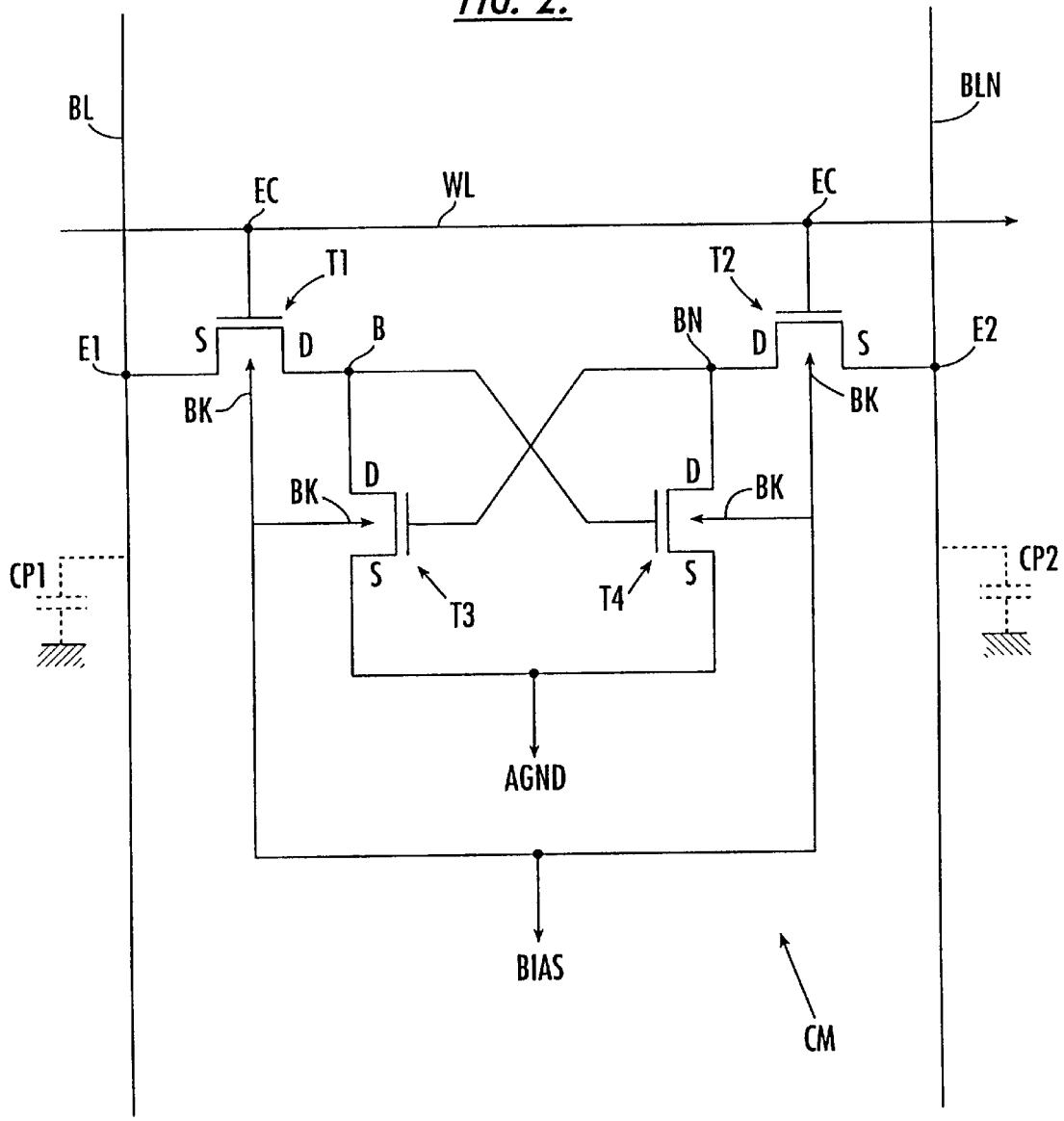
FIG. 2 in a diagrammatic representation of a memory cell according to the invention constructed from NMOS transistors.

Each memory cell CM (FIG. 2) comprises two NMOS access transistors, labeled T1 and T2 respectively, the respective gates of which are connected to the wordline WL, the corresponding nodes EC thus forming a selection input for this memory cell. In addition to the two access transistors T1 and T2, the memory cell CM comprises two NMOS storage transistors T3 and T4. The capacitance for storing the data in memory is formed by the gate/source capacitance of a storage transistor.

The gate of the transistor T4, as well as the drain of the transistor T3 are linked to the drain of the access transistor T1, the corresponding node being labeled B. Similarly, the gate of the storage transistor T3, as well as the drain of the storage transistor T4 are linked to the drain of the access transistor T2, the corresponding node being labeled BN. The respective sources and the access transistors T1 and T2 are linked respectively to the two control inputs E1 and E2. Lastly, the sources of the two storage transistors T3 and T4 are together linked to a first predetermined bias voltage AGND.

Furthermore, the substrate BK of each transistor of the memory cell, or indeed the well BK of this transistor if the latter is disposed inside a well, is advantageously linked to a second bias voltage BIAS. This being so, it is particularly advantageous for the transistors of the memory cell CM to be placed in a well (or even in a double well) constructed within a semiconductor substrate. This embodiment has the advantage of offering less leakage current, of being less sensitive to the noise originating from the substrate, and of being less sensitive to alpha particles.

To limit the losses of charge from the storage capacitors of the storage transistors, and consequently to increase the retention time of a stored data, the voltages BIAS and AGND are advantageously chosen in such a way that these voltages satisfy the following relation:

$$-VT \leq BIAS-AGND \leq 0$$

in which VT denotes the threshold voltage of the transistors.

Such a relation between the voltage BIAS and the voltage AGND in fact leads to a positive source-substrate potential difference. This, bearing in mind the substrate effect which is well known to those skilled in the art, leads to an increase in the threshold voltage and consequently to an increase in the retention time. In the example described above, with 0.35 µm technology and a zero AGND voltage, a voltage BIAS substantially equal to −VDD/10 will be chosen, that is to say substantially equal to −0.3 V.

In the case in which the memory cell is constructed from PMOS transistors, the bias voltage AGND is then replaced by the bias voltage AVDD, for example, 3 V. In this case, again to increase the data retention time by using the substrate effect, the voltages AVDD and BIAS will be chosen in such a way that:

$$VDD+VT \leq BIAS-AVDD \leq 0$$

Moreover, the memory cell according to the invention does not require a dedicated fabrication process to construct storage capacitors, and requires just three levels of metallization to construct it as an integrated circuit. A memory cell with a transistor requires five levels of metallization and five additional masks. To illustrate the write operation of the memory cell CM with respect to row number i and column number j, it is assumed that it is desired to write a logic "1".

The cell CM is selected on the one hand by activating the logic signal WLi (WLi=1) through a specific control word MW and on the other hand by selecting the column CLj. Voltages equal to VDD and 0 respectively are then applied to the metallizations BL and BLN of column CLj.

Since the access transistors T1 and T2 are on, the voltage at the node B is equal to VDD−VT while the voltage at the node BN is zero. The storage transistor T3 is therefore off while the storage transistor T4 is on. The logic "1" value is consequently stored in the gate/source capacitance of the transistor T4. It should be noted here that since the transistor T3 is off, the voltage at the node B tends to keep its high value (disregarding the leakages from stray currents of course). Similarly, since the transistor T4 is on, the voltage at the node BN tends to be maintained at its zero level. Consequently, those skilled in the art will appreciate the feature of stability of the memory cell during the write phase. Subsequently, the signal WL is deactivated and the data is then regarded as written.

To write a logic "0", a zero voltage is applied to the metallization BL and a high-level voltage (VDD) is applied to the metallization BLN. It is then the gate-source capacitance of the transistor T3 which stores a charge resulting from the application of the high-level voltage to the node BN.

Figure 3A:
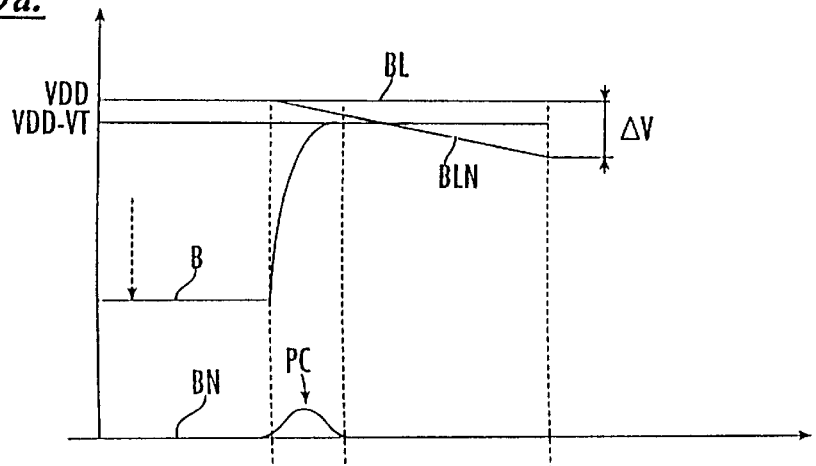
FIGS. 3a–3c diagrammatically illustrate a cell read cycle comprising an automatic refreshing of the stored data, as well as a specific refresh cycle without a read cycle.
Figure 3B:
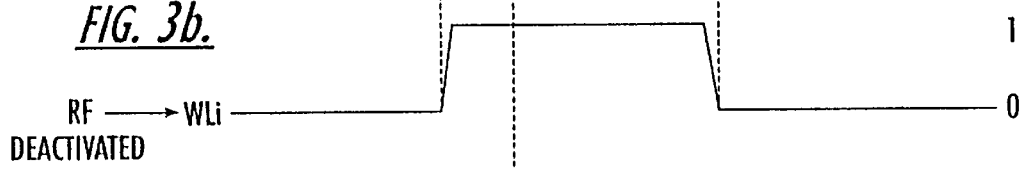

More particular reference is now made to FIGS. 3a and 3b to illustrate the operation of the memory cell in read mode. In the example which will be described it will be assumed that a logic "1" has previously been stored in the memory cell. In the conventional manner, the first step includes precharging the metallizations BL and BLN of column CLj to a high voltage level. In this instance the precharging is to VDD if the precharge circuit comprises PMOS transistors, or else to VDD−VT if the precharge circuit comprises NMOS transistors. It is also assumed that, because of the leakages in the substrate, the potential at the node B has suffered a voltage drop relative to the initial level VDD−VT which was applied to it when writing the logic data.

After deactivating the precharge, the row selection signal WLi is activated, this having the effect of turning on the two access transistors T1 and T2. Consequently, a transfer of the charge from the stray capacitor CP1 of the metallization BL to the node B occurs immediately, the effect of this being to take the potential of this node B to its initial value VDD−VT. The smaller the ratio of the gate/source storage capacitance to the stray capacitance CP1 (or CP2), for example, less than 1/50, the shorter is the duration of transfer. This being so in FIG. 2, the charge transfer duration has been deliberately exaggerated. Those skilled in the art will therefore appreciate that the memory cell according to the invention has the noteworthy property that the data stored is automatically and almost immediately refreshed at the start of a read cycle. It is therefore unnecessary to provide a specific read re-write cycle to refresh the stored data.

Moreover, after activation of the signal WLi, there is a fall in the potential of the metallization BLN relative to the potential of the metallization BL. This leads to a potential difference ΔV, the reading of the sign of which makes it possible to determine the logic value of the data stored in the memory cell.

When the signal WLi is activated, a transient voltage spike PC occurs at node BN. It is vital here to prevent this voltage spike from being too large, and, in particular, greater than or equal to the threshold voltage of the storage transistors so as to prevent the transistor T3 from coming on. The effect of this would be to cause the voltage at the node B to drop and the transistor T4 to turn off. This would ultimately lead to a loss of the information stored, to a refreshing of the data in the "wrong direction" and consequently to the reading of a data whose logic value is the inverse of that which had previously been written. This is why the ratio:

$$\frac{W1/L1}{W2/L2}$$

must be greater than or equal to 1 and preferably greater than or equal to 2. W1 and L1 respectively denote the channel width and length of the storage transistors while W2 and L2 denote the channel width and length of the access transistors.

By way of indication for 0.35 µm CMOS technology, we shall preferably choose W1=1.4 µm, L1=0.4 µm, W2=0.8 µm and L2=0.5 µm thus leading to a ratio R on the order of 2.2. The duration of the read cycle of such a memory cell is typically on the order of 30 ns, while the information refresh duration is much shorter. The refresh duration may typically be on the order of 5 ns for a gate/source storage capacitance on the order of a few femtofarads and a stray bit line capacitance on the order of a few 100 femtofarads.

Generally, when the ratio of the stray capacitance CP1 (or CP2) of a column metallization BL (or BLN) to the gate/source storage capacitance is high enough, for example, greater than 50, and better still greater than 100, the memory cell according to the invention has the noteworthy property of refreshing the data stored in this cell in an extremely short time. Indeed, the duration of transfer of the charge to the storage capacitance is then very small compared with the duration of discharge of the stray capacitance of the column metallization.

Moreover, when on one and the same column it is desired simultaneously to refresh two memory cells one of which stores a "1" while the other stores a "0", the potential of the column metallization tends to be drawn towards the zero value when refreshing the logic "0". This being apriori contraindicated with respect to the refreshing of the logic "1". However, since the ratio of the stray capacitance of the column metallization to the storage capacitance is very large, and hence since the refresh time is very short, it is observed that the voltage level on the relevant column metallization hardly varies during the refresh. It is for this reason that the invention makes it possible to select several wordlines simultaneously, that is to say to refresh several memory cells of the same column simultaneously.

This being so, the greater the number of memory cells selected in a column which store a logic "0" as compared with the number of memory cells selected from this column, but which store a logic "1", the more the voltage level of the column metallization will drop and the more the quality of the information will be degraded. Consequently, those skilled in the art will be able to tailor the maximum number of rows which can be selected simultaneously as a function in particular of the technology used and of the stray metallization capacitance values. In practice, we shall limit ourselves to the simultaneous selection of eight wordlines.

Figure 3C:
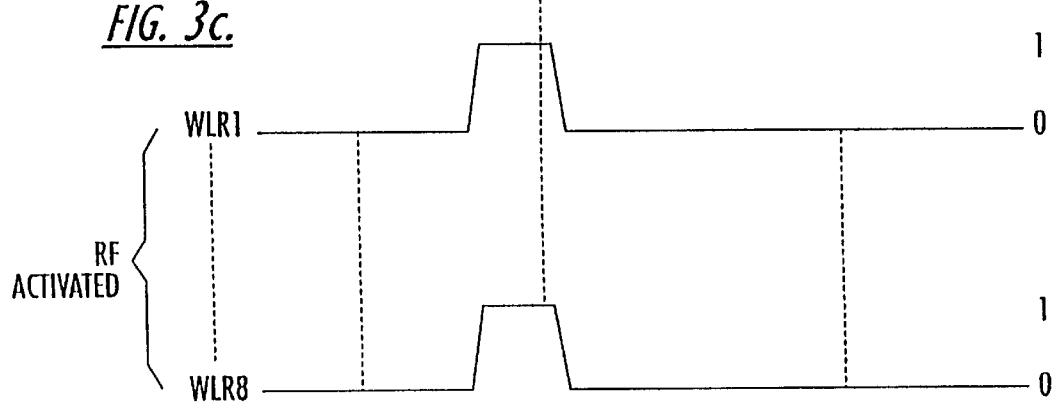

To perform specific refresh cycles of this type, that is to say specific cycles during which no reading of the stored data is carried out, specific refresh pulses WLR1–WLR8 of very short duration are delivered (via the means DL and CTL), as illustrated more particularly in FIG. 3c on each of the wordlines selected, in this instance lines WL1–WL8. In fact, the duration of these pulses must be at least equal to the duration of transfer of charge into the storage capacitance of a memory cell and less than the duration of discharge of the stray capacitance of the column metallization. In practice, pulses with a duration slightly greater than the duration of transfer of charge into the storage capacitances will be chosen, that is to say, pulses whose duration is slightly greater than the duration of refresh of the stored data.

In this regard, the command means deliver a specific refresh signal RF to the row decoder DL (FIG. 1). The consequence of this is that, when it is activated, several wordlines are selected simultaneously. Of course, when the signal RF is not activated the row decoder selects just a single row at a time in respect of the writing or reading of the memory. Those skilled in the art will readily be able to construct such a row decoder from logic gates.

That which is claimed is:

1. A dynamic random access memory comprising:
   at least one block of memory cells organized in rows and columns;
   row selection means associated with said at least one block of memory cells and having a first state able to select a single row of memory cells of said at least one block of memory cells;
   a plurality of column metallizations;
   all of the memory cells of one and the same column being connected between two column metallizations, each memory cell comprising two storage transistors and two access transistors;
   said two storage transistors having a same first quotient of channel width to channel length;
   said two access transistors both having a same second quotient of channel width to channel length;
   a ratio of the first quotient and the second quotient being greater than or equal to one;
   a ratio of capacitance of the column metallization to a gate/source capacitance of each storage transistor being at least equal to 50;
   said row selection means having a second state able to select a plurality of rows of memory cells of said at least one block of memory cells simultaneously; and
   means for delivering a pulse on selected rows of the at least one block of memory cells, the pulse having a duration greater than a duration of charge transfer from the column metallization capacitance to the gate/source capacitance of the storage transistor, and less than a discharge duration of the column metallization capacitance.

2. A memory according to claim 1, wherein the ratio of the first quotient and the second quotient is greater than or equal to 2.

3. A memory according to claim 1, wherein the ratio of the column metallization capacitance to the gate/source capacitance is greater than 100.

4. A memory according to claim 1, wherein each memory cell further comprises a first input and a second input respectively connected to the two column metallizations, and a selection input connected to the row selection means.

5. A memory according to claim 4, wherein the source of a first access transistor is connected to the first input and the source of the second access transistor is connected to the second input.

6. A memory according to claim 5, wherein a drain of the first access transistor is connected to a drain of a first storage transistor and to a gate of a second storage transistor.

7. A memory according to claim 6, wherein a drain of the second access transistor is connected to a drain of the second storage transistor and to a gate of the first storage transistor.

8. A memory according to claim 7, wherein sources of the two storage transistors are connected together to a first bias voltage.

9. A memory according to claim 8, wherein gates of the two access transistors are connected to the selection input.

10. A memory according to claim 1, wherein said two storage transistors and said two access transistors all comprise NMOS transistors.

11. A memory according to claim 10, wherein all substrates of the NMOS transistors are connected to a second predetermined bias voltage; and wherein a difference between the second bias voltage and the first bias voltage is negative or zero and greater than an additive inverse of the threshold voltage of the NMOS transistors.

12. A memory according to claim 1, wherein said two storage transistors and said two access transistors all comprise PMOS transistors.

13. A memory according to claim 12, wherein all substrates of the PMOS transistors are connected to a second predetermined bias voltage; and wherein a difference between the second bias voltage and the first bias voltage is positive or zero and less than a sum of the first bias voltage and the threshold voltage of the PMOS transistors.

14. A dynamic random access memory comprising:
   at least one block of memory cells organized in rows and columns;
   row selection means associated with said at least one block of memory cells and having a first state able to select a single row of memory cells of said at least one block of memory cells;
   a plurality of column metallizations;
   all of the memory cells of one and the same column being connected between two column metallizations, each memory cell comprising two storage transistors and two access transistors;
   said two storage transistors having a same first quotient of channel width to channel length;
   said two access transistors both having a same second quotient of channel width to channel length;

a ratio of the first quotient and the second quotient being greater than or equal to one;

a ratio of capacitance of the column metallization to a gate/source capacitance of each storage transistor being above a predetermined value;

said row selection means having a second state able to select a plurality of rows of memory cells of said at least one block of memory cells simultaneously; and means for delivering a pulse on selected rows of the at least one block of memory cells, the pulse having a duration greater than a duration of charge transfer from the column metallization capacitance to the gate/source capacitance of the storage transistor, and less than a discharge duration of the column metallization capacitance.

15. A memory according to claim 14, wherein the ratio of the first quotient and the second quotient is greater than or equal to 2.

16. A memory according to claim 14, wherein the predetermined value of the ratio of the column metallization capacitance to the gate/source capacitance is greater than 50.

17. A memory according to claim 14, wherein the predetermined value of the ratio of the column metallization capacitance to the gate/source capacitance is greater than 100.

18. A memory according to claim 14, wherein each memory cell further comprises a first input and a second input respectively connected to the two column metallizations, and a selection input connected to the row selection means; wherein the source of a first access transistor is connected to the first input and the source of the second access transistor is connected to the second input; wherein a drain of the first access transistor is connected to a drain of a first storage transistor and to a gate of a second storage transistor; wherein a drain of the second access transistor is connected to a drain of the second storage transistor and to a gate of the first storage transistor; wherein sources of the two storage transistors are connected together to a first bias voltage; and wherein gates of the two access transistors are connected to the selection input.

19. A memory according to claim 14, wherein said two storage transistors and said two access transistors all comprise NMOS transistors.

20. A memory according to claim 19, wherein all substrates of the NMOS transistors are connected to a second predetermined bias voltage; and wherein a difference between the second bias voltage and the first bias voltage is negative or zero and greater than an additive inverse of the threshold voltage of the NMOS transistors.

21. A memory according to claim 14, wherein said two storage transistors and said two access transistors all comprise PMOS transistors.

22. A memory according to claim 21, wherein all substrates of the PMOS transistors are connected to a second predetermined bias voltage; and wherein a difference between the second bias voltage and the first bias voltage is positive or zero and less than a sum of the first bias voltage and the threshold voltage of the PMOS transistors.

23. A method for refreshing data stored in a dynamic random access memory device of a type comprising at least one block of memory cells organized in rows and columns; row selection means associated with said at least one block of memory cells and having a first state able to select a single row of memory cells of said at least one block of memory cells; a plurality of column metallizations; all of the memory cells of one and the same column being connected between two column metallizations, each memory cell comprising two storage transistors and two access transistors; said two storage transistors having a same first quotient of channel width to channel length; said two access transistors both having a same second quotient of channel width to channel length; a ratio of the first quotient and the second quotient being greater than or equal to one; a ratio of capacitance of the column metallization to a gate/source capacitance of each storage transistor being above a predetermined value; said row selection means having a second state able to select a plurality of rows of memory cells of said at least one block of memory cells simultaneously; and means for delivering a pulse on selected rows of the at least one block of memory cells, the pulse having a duration greater than a duration of charge transfer from the column metallization capacitance to the gate/source capacitance of the storage transistor, and less than a discharge duration of the column metallization capacitance, the method comprising the steps of:

placing the row selection means in the second state, and transmitting the pulse over the selected rows of the at least one block, the duration of the pulse being greater than the duration of charge transfer from the column metallization capacitance to the gate/source capacitance of a storage transistor, and less than the discharge duration of the column metallization capacitance.

24. A method according to claim 23, wherein the duration of the pulse is approximately equal to the duration of charge transfer.

25. A method according to claim 23, wherein the ratio of the first quotient and the second quotient is greater than or equal to 2.

26. A method according to claim 23, wherein the predetermined value of the ratio of the column metallization capacitance to the gate/source capacitance is greater than 50.

27. A method according to claim 23, wherein the predetermined value of the ratio of the column metallization capacitance to the gate/source capacitance is greater than 100.

* * * * *

UNITED STATES PATENT AND TRADEMARK OFFICE
CERTIFICATE OF CORRECTION

PATENT NO. : 6,002,628
DATED : December 14, 1999
INVENTOR(S) : Noureddine El Hajji It is certified that error appears in the above-identified patent and that said Letters Patent is hereby corrected as shown below:

Column 3, Line 57    Strike: "in"
    Insert: -- is --

Column 5, Line 22    Strike: "$VDD+VT \leq BIAS-AVDD \leq 0$"
    Insert: -- $VDD+VT \geq BIAS-AVDD \geq 0$ --

Signed and Sealed this

Twenty-fifth Day of July, 2000

Attest:

Attesting Officer

Q. TODD DICKINSON

Director of Patents and Trademarks